United States Patent [19]

Dunaway et al.

[11] Patent Number: 4,898,320

[45] Date of Patent: Feb. 6, 1990

[54] METHOD OF MANUFACTURING A HIGH-YIELD SOLDER BUMPED SEMICONDUCTOR WAFER

[75] Inventors: Thomas J. Dunaway, St. Louis Park; Richard K. Spielberger, Maple Grove; Lori A. Dicks, New Hope, all of Minn.

[73] Assignee: Honeywell, Inc., Minneapolis, Minn.

[21] Appl. No.: 274,207

[22] Filed: Nov. 21, 1988

[51] Int. Cl.⁴ .................. B23K 31/02; B23K 37/06
[52] U.S. Cl. .................. 228/245; 228/254; 228/33; 427/250; 427/282
[58] Field of Search .............. 228/123, 180.2, 245, 228/254, 33, 39, 41, 259; 118/721, 301, 406; 427/250; 269/903

[56] References Cited

U.S. PATENT DOCUMENTS

| | | | |
|---|---|---|---|
| 4,032,058 | 6/1977 | Riseman | 228/180.2 |
| 4,179,802 | 12/1979 | Joshi et al. | 228/254 |
| 4,273,859 | 6/1981 | Mones et al. | 228/180.2 |
| 4,396,140 | 8/1983 | Jaffe et al. | 228/123 |
| 4,722,470 | 2/1988 | Johary | 228/256 |
| 4,759,491 | 7/1988 | Fisher | 228/256 |

FOREIGN PATENT DOCUMENTS 2728330 1/1979 Fed. Rep. of Germany ... 228/180.2

OTHER PUBLICATIONS

IBM Technical Disclosure Bulletin, vol. 28, No. 7, p. 2871, Dec., 1985.
IBM Technical Disclosure Bulletin, vol. 14, No. 9, p. 2773, Feb., 1972.
"Electronics" magazine, Sized Solder Bumps, vol. 54, No. 22, pp. 46-48, Nov. 3, 1981.
*Electronic Packaging and Production*, article titled "Japan's Swing to Chip-on-Board," Dec. 1986, pp. 38-41.

Primary Examiner—Nicholas P. Godici
Assistant Examiner—Samuel M. Heinrich
Attorney, Agent, or Firm—W. T. Udseth

[57] ABSTRACT

Disclosed is a method of manufacturing a high-yield solder bumped semiconductor wafer. The method comprises providing a non-solderable transfer substrate having a transfer surface for receipt of solder material; depositing solder material onto the transfer surface to form solder bumps in a predetermined pattern; aligning solderable conductive elements of a semiconductor wafer with the predetermined solder bumps on the transfer surface; and reflowing the patterned solder bumps into wetted contact with the wafer conductive elements.

17 Claims, 10 Drawing Sheets

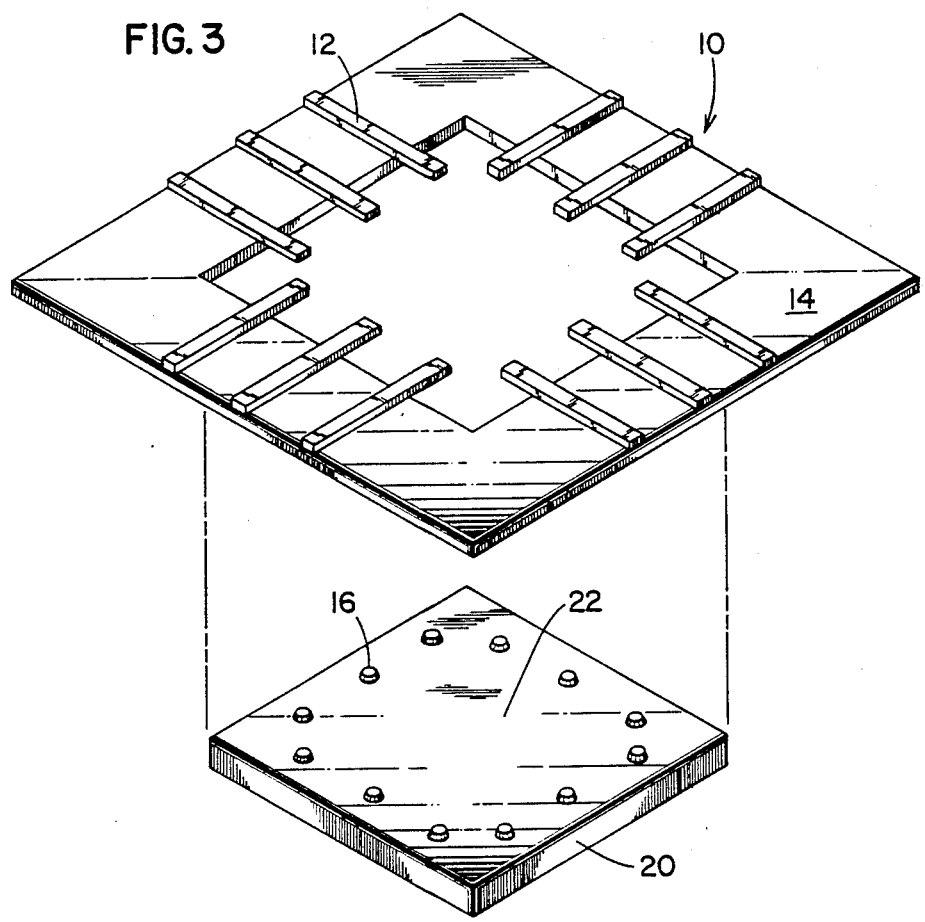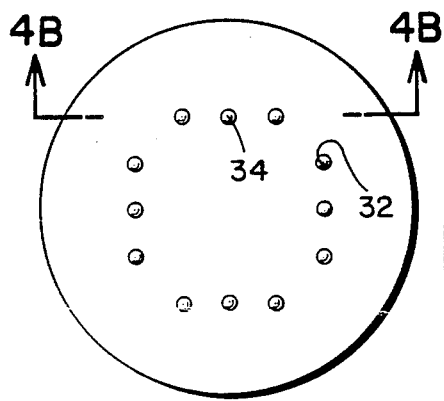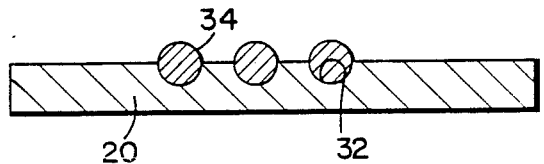

PRIOR ART PRE REFLOW

PRIOR ART POST REFLOW

PRE REFLOW

POST REFLOW

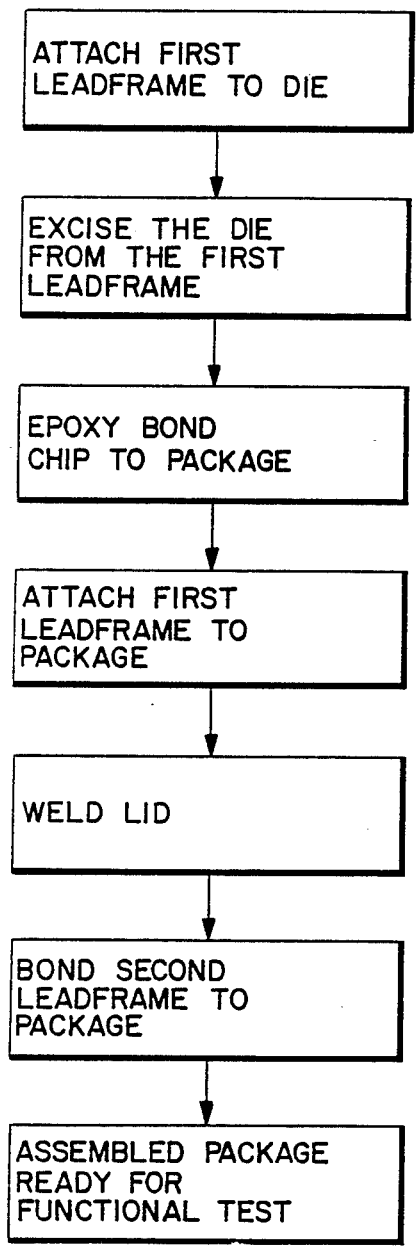

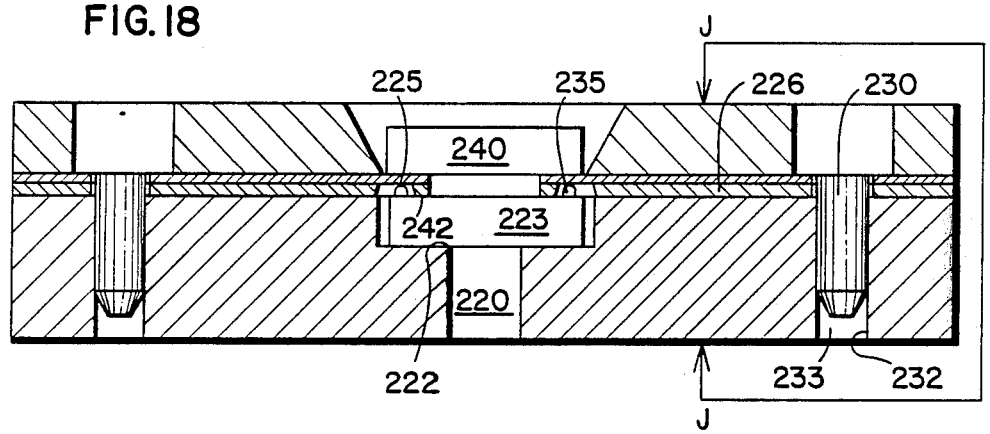
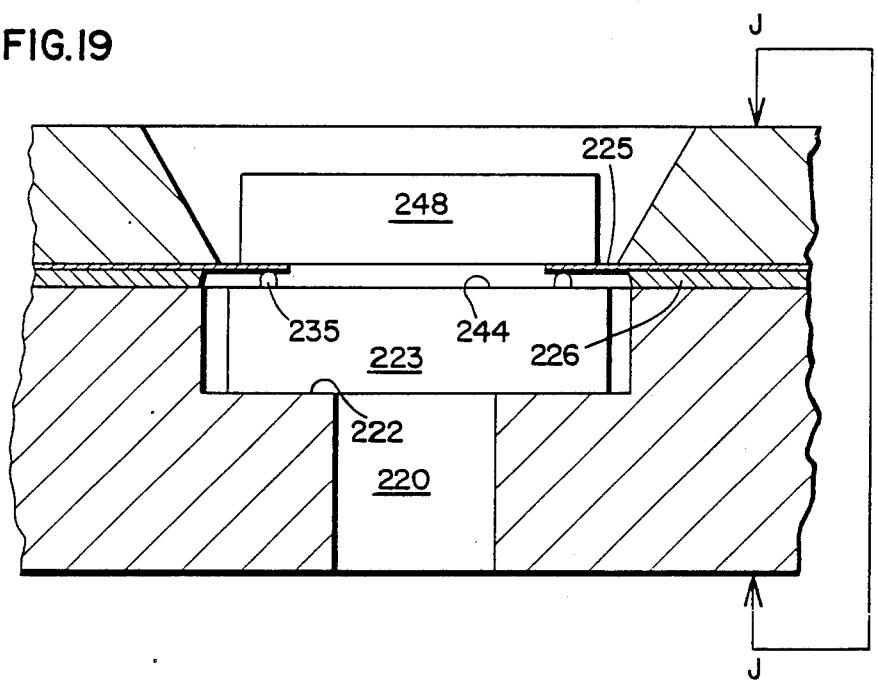

METHOD OF MANUFACTURING A HIGH-YIELD SOLDER BUMPED SEMICONDUCTOR WAFER

FIELD OF THE INVENTION

The present invention relates to the field of electronic component bonding and packaging.

BACKGROUND OF THE INVENTION

In the field of electronic component packaging numerous problems exist. For example, the bonding of conductive elements of a leadframe to a semiconductor chip often results in chip passivation fractures during the bonding process. These fractures may occur due to excessive bonding force, misalignment occurring during the bonding process, or inadequate standoff means to prevent the conductive elements from being undesirably compressed against the semiconductor chip. Other fracture phenomena occur during thermal cycling of components and result in poor quality products which are either rejected or which perform improperly. Further problems in the packaging field include an inability to provide fine pitch geometries at various levels of chip packaging to achieve the area utilization demands of higher density devices. These all represent particularly long-standing problems and constant challenges in the packaging field, but ones which find solutions in the present application in various ways.

Wasteful, inefficient, or unnecessary processing steps in the production of semiconductor chips and other electronic components accounts for substantial redundancy in the packaging field. Moreover, as more complicated devices require additional processing steps such devices become increasingly susceptible to processing errors which may lead to poor performance and low yields. In the field of semiconductor chip production alone, the volume of chips manufactured results in substantial numbers of improperly packaged devices due to processing problems. Moreover, it is quite common to experience low production yields in the initial production phases of newly designed chips. By streamlining and minimizing the steps required in a chip production process, efficiencies combine to provide greater overall yield percentages.

Yet a further problem identified in the prior art of electronic component packaging includes devices which are manufactured having inefficient utilization of chip surface areas. Non-efficient structure in the packaging field is tantamount to reducing the performance capabilities of the electronic device. Rather, more efficient use of existing space on an electronic component is the touchstone to improved performance. Therefore, the more efficient use of the valuable chip surface area on electronic components permits advanced capabilities, such as improved spacing and pitch geometries. The present invention provides immediate improvements affecting the production and operation of electronic devices and assemblies which overcome these problems identified above.

Various bonding techniques exist which permit bonding of electronic components. These bonding techniques include the use of relatively hard-bonding material, such as gold, and soft-bonding material such as solder compositions. Although the use of solder compositions is known in the art, such compositions have generally been used as formations which are placed on semiconductor chip devices during the chip production process. Various compositions of solder have been used, including tin-lead compositions. Commonly, soft solder material is plated onto interface regions of components as final processing steps prior to final component testing. It has now been found valuable to apply soft solder material, in the form of preformed solder bumps, to other structures in the packaging process. One example of another structure is the conductive elements of a leadframe. By placing preformed solder bumps on the conductive elements of a leadframe, substantial efficiencies in the overall production, packaging, and testing cycle occur. Alternately, the present invention provides improved solder compositions for strengthening the bonding capability of solder bumps preformed onto semiconductor chips.

Therefore, the present application describes improved packaging and bonding of electronic components to achieve optimum signal fidelity, fine pitch geometries, improved yield, greater reliability, and various manufacturing efficiencies. The improvements comprise several unique embodiments of tape leadframe technology, solder bump transfer and bonding techniques, and preferred bonding and fluxing material compositions.

SUMMARY OF THE INVENTION

The present invention is a method of manufacturing a high-yield solder bumped semiconductor wafer. The method comprises providing a non-solderable transfer substrate having a transfer surface for receipt of solder material; depositing solder material onto the transfer surface to form solder bumps in a predetermined pattern; aligning solderable conductive elements of a semiconductor wafer with the predetermined solder bumps on the transfer surface; and reflowing the patterned solder bumps into wetted contact with the wafer conductive elements.

BRIEF DESCRIPTION OF THE DRAWINGS

FIG. 3 is a perspective exploded view of a leadframe assembly positioned over a solder bumped transfer substrate.

FIG. 4A illustrates a transfer substrate shown with cavities and solder pellets within the cavities.

FIG. 4B is a side sectional view along lines 4B-4B in FIG. 4A showing the solder pellets resting within the transfer substrate cavities.

FIG. 11 is a flow diagram illustrating representative prior art leadframe and chip assembly processes.

FIG. 12 is a flow diagram illustrating a preferred low-cost tab package leadframe and chip assembly process.

FIG. 18 is a side sectional view of a leadframe and chip holding device configured with a rigid insert to achieve soft solder bump bonding uniformity.

FIG. 19 is an enlarged side sectional view generally corresponding to FIG. 18 illustrating a leadframe and chip holding device configured with a conformal insert to achieve hard bump bonding uniformity.

DETAILED DESCRIPTION OF THE PREFERRED EMBODIMENTS

Detailed preferred embodiments of the present invention are disclosed. It is to be understood, however, that the disclosed embodiments are merely exemplary of the invention, which may be embodied in various forms. Therefore, specific structural and functional details disclosed are not to be interpreted as limiting, but rather as a representative basis for teaching one skilled in the art to variously employ the present invention in virtually any appropriately detailed system or structure. It will be understood that in some circumstances relative material thicknesses and relative component sizes may be shown exaggerated to facilitate an understanding of the invention.

Inventions described in the present application relate to improvements in packaging and bonding electronic components to achieve finer pitch geometries, improved yield, improved reliability, and manufacturing efficiencies. The improvements include several unique preferred features including tape leadframe constructions, solder bump transfer bonding techniques, and preferred bonding and fluxing material compositions.

Figure 1:
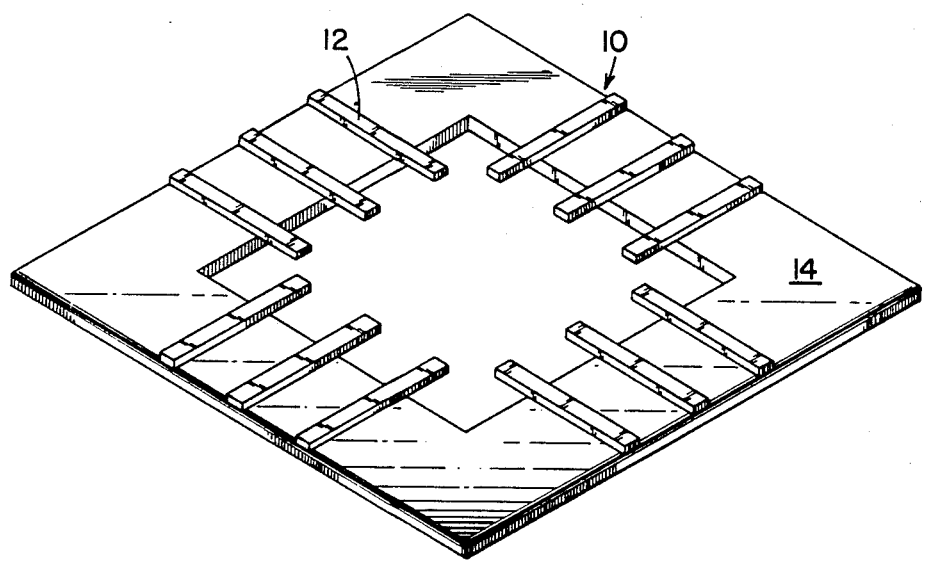
FIG. 1 is a perspective view of a representative leadframe assembly.

Referring to FIG. 1, an exemplary leadframe 10 is illustrated. It is appreciated that leadframes are variously constructed and shaped; however, the basic function of leadframes is to provide conductive elements for use in interconnecting the leadframe with at least one other electronic device. Leadframe 10 comprises conductive elements 12 for transmitting input and output signals to bonding locations on an electronic device. Leadframes 10 may comprise a tape leadframe having dielectric material 14 for separating the conductive elements. Dielectric material 14 may also be constructed and arranged to provide cushioning during bonding as well as stress relief during operation and/or temperature cycling of the device.

As the complexity of electronic devices increases, the demands of properly packaging such high performance and/or multi-lead devices become more challenging. Indeed, current semiconductor chips may require several hundreds of bonds per chip in the packaging process. Specifically, certain chip capacities are now between about 600 to 800 bonds per chip. It is expected within the field of packaging technology that near-term bonding requirements will exceed 2000 bonds per chip. However, as the number of bonding operations per chip increases, the stress on each chip also increases as each bond is formed; other potential sources of chip failure or rejection also increase as the number of bonding operations increase.

One method of reducing the number of bonding operations per chip is to align a leadframe, such as leadframe 10, with appropriate bonding locations on a semiconductor chip and then exert a single bonding force to the leadframe to effect multiple bonds simultaneously. When using such a technique, commonly called "gang-bonding", the problems of using hard bonding materials are best exemplified when using a hard bonding material with gang bonding, greater force is needed to effect a compression bond than if the bonding material were more soft. Accordingly, compression bonding of hard bonding material frequently results in undesired chip passivation cracking and over-compression of conductive elements of the leadframe.

Although the use of tape leadframes provides certain advantages relating to self-alignment and vertical stand-off of the conductive elements of the leadframe with respect to bonding interface regions on chips, the use of soft solder material is also of great value. Heretofore, soft bonding material, such as solder bonding material or soft solder, has been confined to placement on active electronic device interface regions rather than onto a leadframe. However, the placement of preformed solder material onto leadframe conductive elements relieves the active electronic components, such as chips, from potential adverse effects related with such processes. Perhaps even more significantly, by preforming solder bumps to leadframe conductive elements rather than to devices such as chips, the devices themselves can be tested for acceptability before they are integrated into a leadframe assembly or even a chip carrier. Therefore, it is desirable to place preformed solder bumps 16 on leadframe conductive elements to achieve an overall improvement in device yield and reliability. Further, by placing preformed solder bumps on leadframe means 10 the bonding material may be inspected independent of the chip production process and independent of the process wherein leadframes are mated with other devices.

Figure 2:
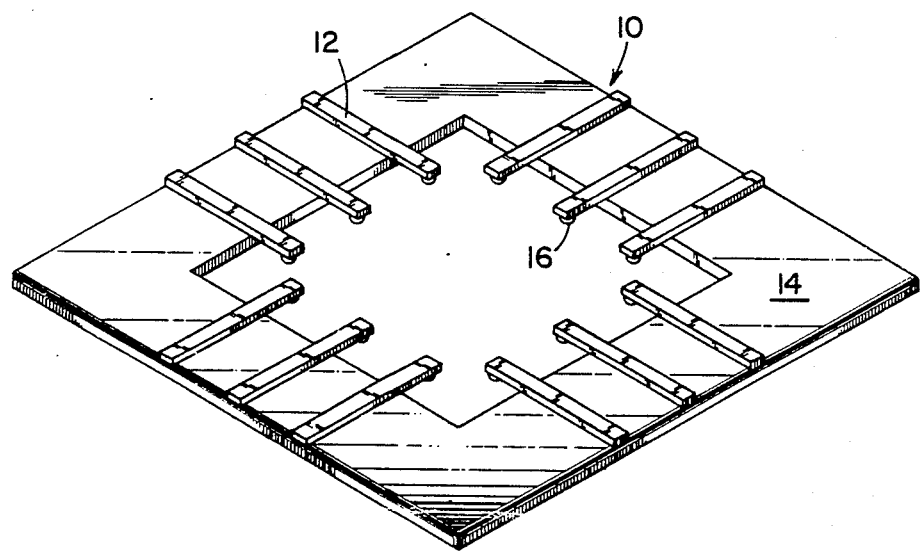
FIG. 2 is a perspective view of a representative leadframe assembly with preformed solder bumps attached to conductive elements.

Accordingly, as illustrated in FIG. 2, a leadframe assembly is provided having conductive elements 12 preformed with solder bumps 16 for use in interconnecting the leadframe with an electronic device. Preferably, leadframe 10 comprises at least one of power, ground, and signal conductive elements for transmitting input and output signals to bonding locations on an electronic device. Also, solder bumps 16 are preformed onto conductive elements 12 in a pattern which will permit bonding with desired bonding locations on an electronic device. Preferably, preformed solder bumps 16 comprise a tin and lead composition.

A method of manufacturing a leadframe assembly having preformed solder bumps, which may also be referred to as a bond-when-ready bumped leadframe, is provided. This method preferably comprises the steps of positioning leadframe 10 for receipt of preformed solder bumps 16 onto conductive elements 12, and then attaching the solder bumps at desired locations on the conductive elements. Preferably, the solder bumped conductive elements may then be selectively bonded with bonding locations on an electronic device. As illustrated in FIG. 3, the step of preforming solder bumps 16 comprises providing a non-solderable transfer substrate 20 having a transfer surface 22 for receipt of solder material in the form of solder bumps or deposits 16. The solder material is deposited onto transfer surface 22 to form solder deposits in a predetermined pattern. Conductive elements 12 of leadframe 10 are then aligned and mated with patterned solder bumps 16. Finally, the conductive elements and patterned solder bumps are heated to the point of reflow to permit the solder deposits to transfer into wetted contact with the leadframe 10 conductive elements 12.

Solder material may be deposited onto transfer substrate 20 in several different ways. The deposition step may be accomplished by positioning a conventional shadow mask on transfer surface 22 and than evaporating solder material through apertures in a shadow mask to form preformed solder deposits 16 on transfer surface 22. Alternately, solder material may be plated onto transfer surface 22 using conventional plating techniques. Yet another method of preforming solder deposits 16 onto a transfer substrate 20 includes providing a non-solderable transfer substrate, as shown in FIG. 4A, having a plurality of cavities 32 configured for positioning preformed solder material. Then, preformed solder pellets 34 are deposited onto the transfer surface for nesting in cavities 32 in a predetermined pattern, as illustrated in FIGS. 4A and 4B. Preferably, transfer substrate 20 comprises a reusable material for multiple transfers of solder material.

A method of constructing a leadframe assembly is also provided in which the conductive elements are preformed with solder bumps for bond-when-ready packaging of a semiconductor chip. This method comprises providing a leadframe 10 preferably comprising at least one of power, ground, and signal conductive elements 12, and preforming solder bumps 16 onto conductive elements 12 of leadframe 10 to provide means for selectively bonding the conductive elements to semicoductor chip bonding pads. The various methods of depositing preformed solder bump material onto leadframe 10 as described above pertain to this embodiment as well. Although other methods of depositing preformed solder bump material onto transfer substrate 20 and leadframe 10 are available, those identified above are preferable. This solder bump transfer technology permits transfer of preformed solder bump material to active die and wafers, in addition to leadframes. Certain other advantages accrue by use of this transfer substrate technology, and will be later discussed in greater detail.

Specific applications of preformed solder bumped leadframes include advantageous connecting of bumpless semiconductor chips and other devices to preformed solder bumped leadframes. Indeed, the overall concept of bumping leadframes and in particular soft solder bumping of the leadframes is intended to take the bumping process out of the chip production cycle. In other words, the chip experiences no bumping process until bonded to the leadframe. This is important for several reasons, not the least of which is time and efficiency. This process prevents exposing the chip to potential yield problems and plating techniques such as voltage spiking, plating current generation, or plating corrosive action from plating solutions. Also, it is not uncommon for extremely low yields to result from the first 6 months of a new production process for chips. Indeed, effective yields may only then curve up to maximums of between 60% to 80% per production batch over several years. Therefore it is quite important to minimize yield problems wherever feasible. By utilization of a pre-tested reliable inventory of unbumped chips, increased batch yields may be realized. Stated another way, by taking the bumping process out of the chip production cycle, only 100% yield bumped leadframes and 100% yield chips will be used when bonding. This permits separating the chip fabrication process from the bumping process without adverse impact on any of the components. This also permits parallel processing and production which in the past was combined as a single, less efficient, serialized event. This method of manufacture enhances cost reductions and permits bond-when-ready assembly.

Another advantage of applying solder bumps to leadframe conductive elements relates to the prior art problem of solder fatigue due to neutral point distancing. This problem arises when chips include bumps which are positioned on surfaces of a rigid substrate which expand due to thermal cycling or operation at a rate different than the chip. This often results in separation of the bump from the chip and degraded chip operation. In contrast, by placing the solder bumps on leadframe conductive elements which are substantially independent from these thermal stresses noted above, the bumps remain attached. This advantage provides improved reliability.

Figure 5:
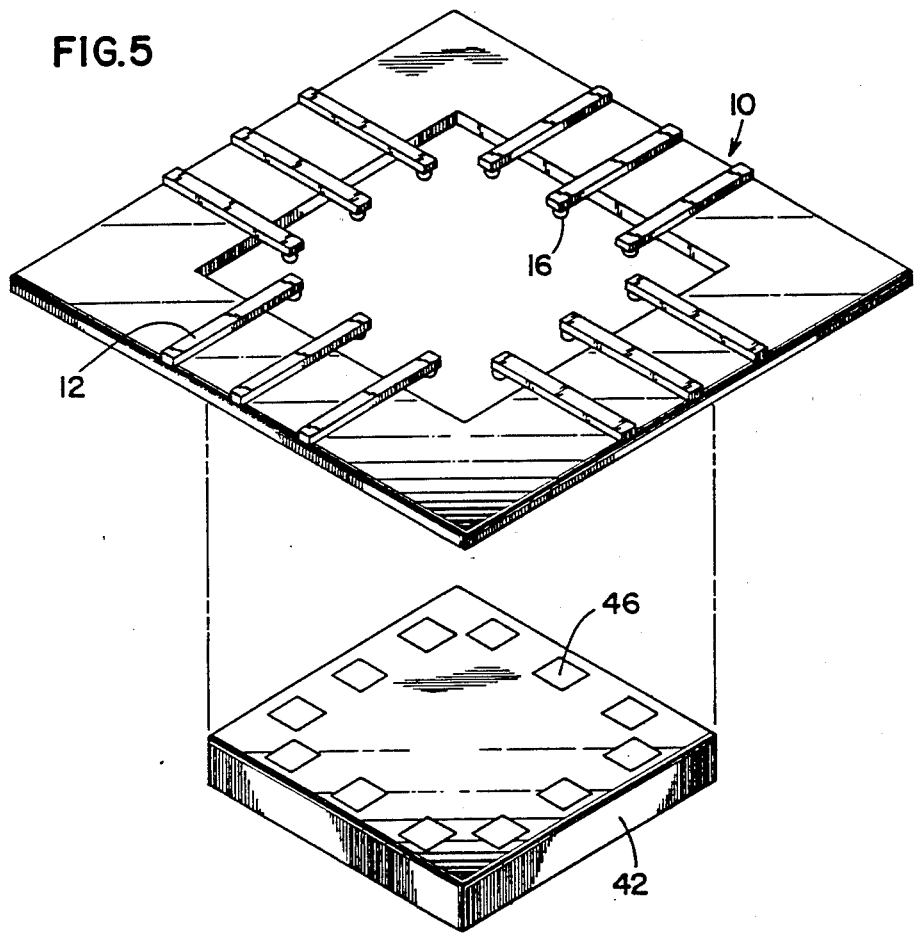
FIG. 5 is a perspective exploded view of a leadframe assembly with preformed solder bumps on conductive elements positioned over corresponding bonding pads of a semiconductor chip.

Therefore, this invention provides a low-cost high-yield semiconductor chip and leadframe assembly kit. As illustrated in FIG. 5, this kit preferably comprises a semiconductor chip 42, leadframe 10, and bonding means comprising solder bumps 16 preformed to leadframe 10. Preferably semiconductor chip 42 comprises wetable, non-reflowable interface regions 46, also commonly referred to as pads, for input and output of signals to and from the chip. Leadframe 10 preferably comprises a leadframe having power, ground, and signal conductive elements 12 for transferring signals to and from chip 42 interface regions 46. This invention also encompasses a reduced process high-yield semiconductor chip and leadframe assembly kit comprising a semiconductor chip 42 comprising bumpless interface pads 46 for input and output of signals to and from chip 42, and leadframe 10 comprising a leadframe including solder bumped conductive elements 12 arranged for reflow bonding with chip pads 46.

A method of manufacturing a low-cost high-yield leadframe assembly, as illustrated in FIG. 5, includes providing a semiconductor chip comprising wetable, non-reflowable interface pads for input and output of signals to and from the chip; aligning a leadframe comprising preformed solder bumped conductive elements with the interface pads or regions and reflowing the preformed solder bumps for conductively interconnecting the leadframe conductive elements with the chip interface pads. Similarly, a method of manufacturing a reduced process high-yield leadframe assembly comprises positioning a semiconductor chip comprising bumpless interface pads for input and output of signals to and from the chip; aligning leadframe conductive elements with the interface pads, the leadframe comprising means for reflow bonding the conductive elements to the chip pads; and reflow bonding the leadframe to the chip. Preferably, the method of reflow bonding a reduced process high-yield leadframe assembly comprises reflowing solder bumps which were previously preformed onto the conductive elements.

Figure 6:
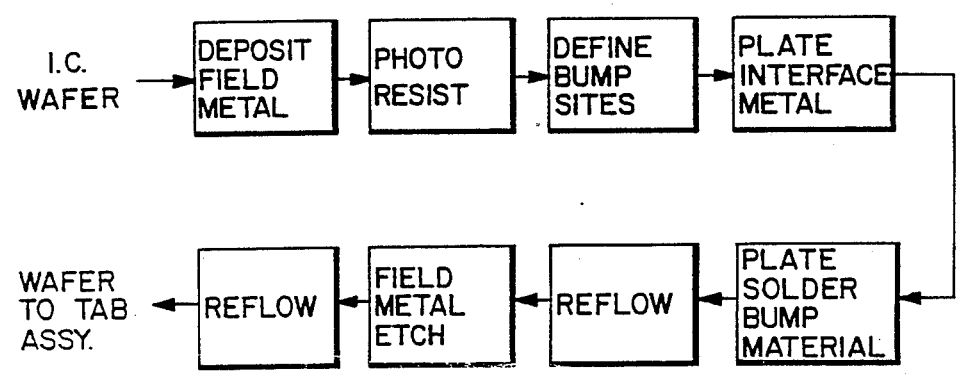
FIG. 6 is a flow chart representation of prior art semiconductor chip production cycle steps relating to the deposition of solder bump material.

FIG. 6 is a schematic representation of exemplary prior art chip production process steps. As shown in FIG. 6, the process of plating solderable bumps to semiconductor chips or wafers typically comprises numerous steps integral to the chip production cycle. These steps normally comprise providing an integrated circuit wafer and first depositing a field metalization. Next, photo-resist techniques are employed and the sites for metalized bumps are defined by etching holes in the photo-resist. A layer of interface metal is then deposited into the etched holes. Then, metalization to form the bumps is plated onto the interface metal. The metalization may be a tin-lead composition. The bump metalization is then reflowed and the steps of etching the field metal follow. Finally, the metalization is again reflowed to provide smooth and readily bondable metalized bumps. The tab may then be bonded to the metalized bumps on the integrated circuit chip or wafer. The current low-cost tab package leadframe invention eliminates substantially all of the process steps illustrated in FIG. 6, and therefore reduces chip production cycle time as well as reducing risk of damage to the chip. This is particularly relevant to semiconductor chips which are either expensive to manufacture or which require long production cycles. Indeed, substantial commercial advantage may be realized by reducing production cycles and providing greater ability for parallel production techniques.

The current pre-bumped leadframe invention provides means for achieving the above objectives by providing pre-bumped leadframes for bond-when-ready attachment to bare, e.g. non-bumped, chips or wafers. This is greatly advantageous over the prior art in that it permits independent chip inspection as well as independent bump inspection prior to the bonding process so that a very high-yield, if not 100%, of operational devices may be achieved quite readily. Note that this process eliminates the wasteful steps involved in bumping semiconductor chips prior to testing the chip, as is commonly done and as shown in FIG. 6. Due to these advantages, this invention may also be described as a maximum yield pre-bumped invention.

In the event that pre-bumped chips are desired, e.g. maintaining the wasteful production steps of the prior art, then substantial improvements in bonding reliability may still be achieved according to the present single phase solder composition invention, described in greater detail later in this application.

It is appreciated that the use of vapor deposition and plating as means for providing reflowable solder material for bonding electronic devices is generally well known in the art. However, such processes have neither addressed nor solved many problems related to prior art processes. In particular, prior art techniques of vapor depositing solder material onto active die or wafers include placing a shadow mask comprising numerous apertures onto the surface of an active die or wafer. The assembly is then placed in a chamber where the solder material is evaporated and deposited onto the wetable portions of the wafer that are exposed through the apertures of the shadow mask. Frequently, however, difficulties arise with respect to the shadow mask scratching portions of the active die or wafer. Such scratching may lead to considerable reliability and yield problems affecting active components. Also, as the requirement for higher density devices increases, the masks must include more apertures. Substantial problems related to aperture density and mask planarity result. For example, insufficient separation between apertures provides only partial bump laydown on the active wafers.

Yet another problem occurs when excess solder material passes through certain apertures causing electrical bypasses on the active wafer or die. This phenomenon may also be caused by certain masking processes which result in the effect known as "haloing." This "haloing" leaves undesirable residue on active die which is avoided through use of the present invention. Furthermore, the evaporation process used in the prior art requires exposure of the active wafer or die to the temperature and pressure variations associated with conventional vapor deposition techniques. Indeed, the heat generated during the evaporation process causes certain masks to adhere to and damage the active device. Elimination of this damage to the active wafer or die is desirable. Also, if an active wafer or die receives only a partial bump or metalization laydown, the active component must either be discarded or further processed in order to achieve a proper pattern of solderable material. Once again, neither of those options are desirable or efficient.

Figure 7A:
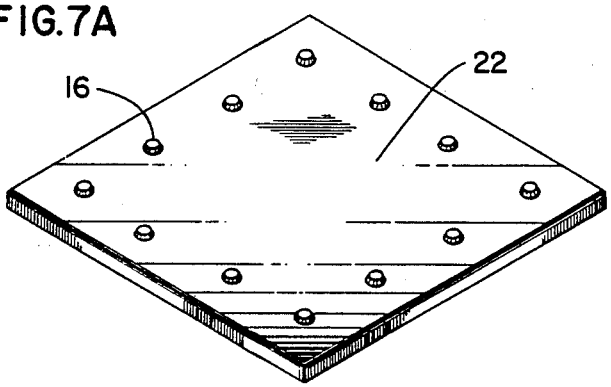
FIG. 7A is a perspective view of a transfer substrate with solder material deposited on it.
Figure 7B:
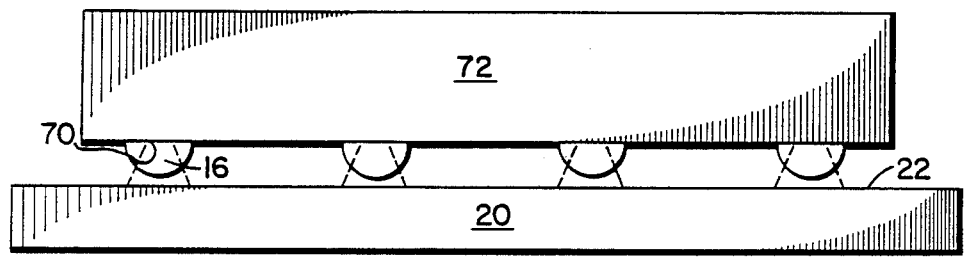
FIG. 7B is a side elevation view of a solder bumped transfer substrate analogous to that shown in FIG. 7A following transfer of the solder bumps to a representative semiconductor chip.

One solution to these problems of vapor deposition processes includes manufacturing a high-yield solder bumped semiconductor wafer using new methods. One such method, illustrated in FIG. 7A, includes providing a non-solderable transfer substrate 20 having a transfer surface 22 for receipt of solder material. Solder material is then deposited onto transfer surface 22 to form solder bumps 16 in a predetermined pattern, as shown in FIGS. 7A and 7B. The deposition of the solder material onto transfer surface 22 may be accomplished by either plating, vapor deposition, or pellet placement in cavities as earlier referred to and explained in this application. Next, as shown in FIG. 7B, the method includes aligning solderable conductive elements 70 of a semiconductor wafer 72 with the patterned solder bumps 16 on transfer surface 22, and then heating and reflowing the patterned solder bumps into wetted contact with wafer 72 conductive elements 70. Thus, this process eliminates the problems described above which reduce the reliability of prior art active devices exposed to process steps now rendered unnecessary by the invention just described.

Thus, the present solder bump transfer invention permits production of high-yield solder bumped semiconductor wafers 72 without risk of scratching by a shadow mask, and without any transfer of residual solder material such as that which forms halos on prior art active die. Additionally, the above preferred method of manufacturing a high-yield solder bumped semiconductor wafer avoids the difficulties associated with the conventional plating process of solder bumping active wafers and die. The previously mentioned problems of voltage spiking, current generation, and acidic corrosion are overcome by utilizing intermediate transfer substrate 20 as described above. Also, exposure of the active device to the prolonged cycle time associated with the plating process is avoided.

Figure 8A:
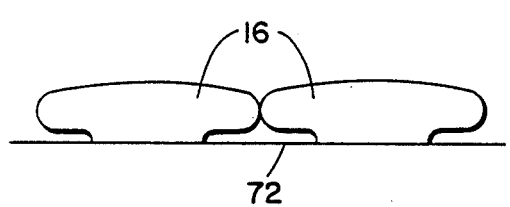
FIG. 8A is a side elevation view of prior art non-reflowed plated bumps positioned on a chip surface.
Figure 8B:
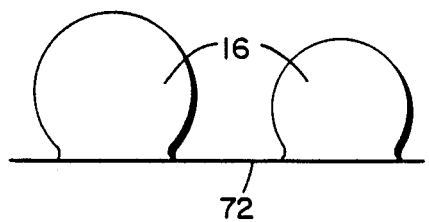
FIG. 8B is a side elevation view of prior art reflowed plated bumps illustrating non-uniform bump sizes.
Figure 8C:
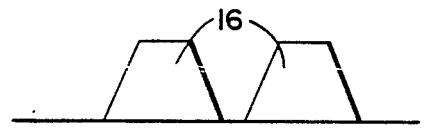
FIG. 8C is a side elevation view of preferred high-yield high-density solder bumps prior to reflow.
Figure 8D:
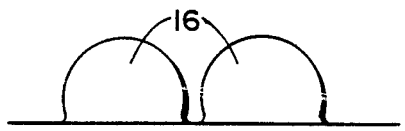
FIG. 8D is a side elevation view of the solder bumps shown in FIG. 8C after reflow.

Yet another problem relating to the prior art plating of active die involves the characteristic mushrooming shape of solder bumps formed on active die using the plating process, as shown in FIG. 8A. This results in waste of space due to the normally expanded diameter at the top portion of such solder bumps. Accordingly, the prior art process of plating active die is density limited and of little value when attempting to manufacture fine pitch geometry devices. This phenomenon, wherein a solder bump includes a mushroom shaped top portion over a narrower base, results in such conventional plating being only good to pitch densities of about 8 mil. In contrast, use of the transfer method described above according to the present invention permits bump spacing of at least as small as about 1 to 2 mil and, therefore, achieves the objectives of tighter pitch geometry construction, as represented in FIG. 8C. Indeed, by comparing the bump spacing using prior art plating techniques before and after reflow, shown in FIGS. 8A and 8B, and comparing the finer pitch bump spacing according to the present transfer method invention, shown in FIGS. 8C and 8D, the advantage is quite clear. Also, as shown in FIG. 8A and 8B, the prior art plating process promotes greater potential for uneven bump sizes due to the increased possibility that the pre-reflow mushroom shaped deposits will be in contact.

Although later detailed discussion will relate to the preferred compositions of solder bonding material, the above method of manufacturing a high-yield solder bumped semiconductor wafer preferably further comprises use of solder material comprising less than 3% by weight tin.

Figure 9:
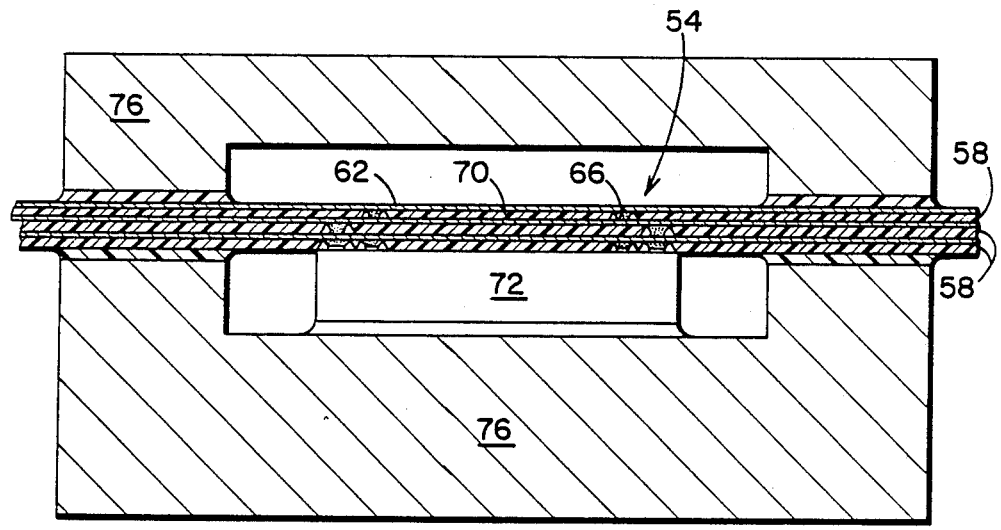
FIG. 9 illustrates a side sectional view of a stacked leadframe assembly and protective means.
Figure 14:
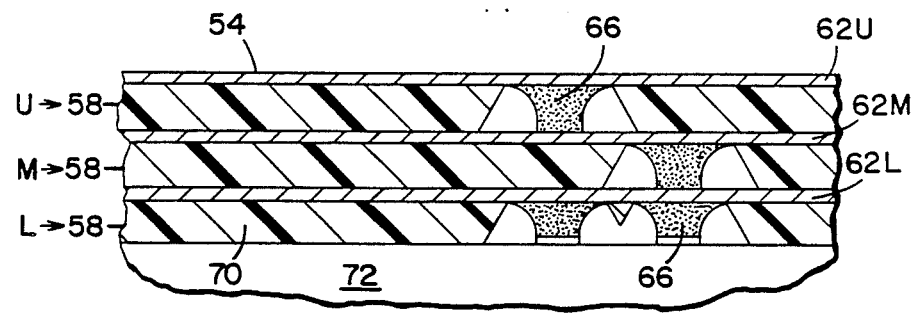
FIG. 14 is a side sectional view of a stacked tape leadframe assembly.

In the field of electronic packaging, performance characteristics of individual electronic components may be improved in various ways. One such technique is to optimize the use of existing space on an electronic device as illustrated in FIGS. 9 and 14. The embodiment of the present invention shown in FIGS. 9 and 14 represents improved means for space utilization on a component by use of a stacked tape leadframe assembly 54. More particularly, stacked tape leadframe assembly 54 provides means for arranging multilayer conductive leads access to more area of an electronic component as well as on various vertically spaced lines or layers. Stacked tape leadframe assembly 54 is designed for use with integrated circuit chips and comprises multiple leadframes 54 arranged in stacked relation. Each leadframe 54 preferably comprises at least one conductive element 62. Solder bump means comprising solder bumps 66 are provided for electrically and mechanically connecting selected conductive elements 62 of leadframes 54. As is further illustrated in FIG. 14, preferred stacked leadframes 54 comprise non-wetable surfaces comprising dielectric material 70 for maintaining separation between adjacent leadframes 54 and for dielectrically separating multiple conductive elements within a leadframe. Also, preferred stacked tape leadframe assembly 54 and solder bumps 66 are constructed and arranged to connect conductive elements 62 with integrated circuit chip 72.

FIG. 14 shows one embodiment of stacked tape leadframe assembly 54 comprising a first upper leadframe labelled U including a conductive element 62u, a second lower leadframe labelled L comprising a conductive element 62l, and a third middle leadframe labelled M comprising a conductive element forming a signal line 62m positioned in stacked relation between the first and second leadframes to form a constant impedance stripline, or constant impedance microstrip configuration. The dimensions of leadframes 54 and their conductive elements define the electrical parameters of any circuit formed. Indeed, conductive elements 62 may also comprise ground conductors or ground planes. Alternately, certain conductive elements 62 may comprise power conductors, and such power conductors may further be configured as power planes. As previously noted, conductive elements 62 may also comprise signal lines.

Referring now to FIG. 9, a stacked leadframe assembly 54 is shown. Stacked leadframe assembly 54 preferably comprises multiple leadframes 58 arranged in stacked relation with each leadframe comprising linear conductive elements 62. Also, solder bump means is provided comprising stacked solder bumps 66 for electrically and mechanically connecting conductive elements 62. FIG. 9 particularly shows a stacked leadframe assembly 54 with protective means 76. Preferred protective means 76 is located around portions of stacked leadframe assembly 54 while permitting other portions of the stacked leadframes to protrude from protective means 76 to provide connection with other devices.

This stacked tape leadframe assembly invention thus incorporates a plurality of discrete leadframes connected mechanically and electrically through the use of stacked leadframes. Accordingly, stacked tape leadframe assembly 54 solves problems associated with signal management of high speed integrated circuits, such as characteristic impedance control, inductance, capacitance, resistance and cross-talk noise. Stacked tape leadframe assembly 54 may be configured as a controlled impedance structure by regulating the height of solder bumps 66 or by configuring other physical characteristics of leadframes 54. Thus, stacked tape leadframe assembly 54 provides innovative cost reductions over conventional multilayer ceramic printed circuit boards and packages while also providing significant performance advantages.

Figure 10:
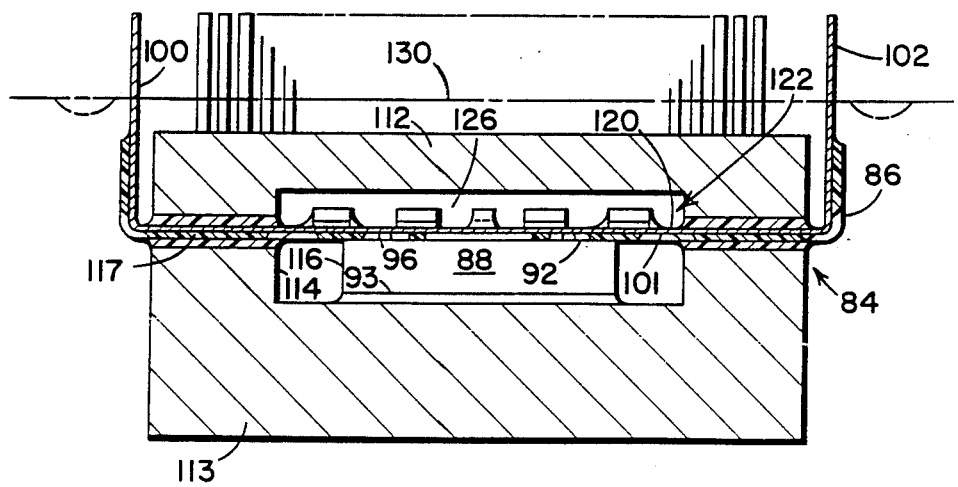
FIG. 10 illustrates a side sectional view of a low-cost tab package and protective means.

Referring now to FIG. 10, a side sectional view of a low-cost leadframe package 84 is illustrated. Low-cost leadframe package 84 provides substantial savings during the production process as well as substantial reliability improvements during operation. As shown in FIG. 10, low-cost leadframe package 84 preferably comprises a leadframe 86, a semiconductor chip 88, bonding means comprising a plurality of originally preformed solder bumps 16, and protective means 76 for providing sealed and environmental protection around semiconductor chip 88 and portions of leadframe 86 while permitting other portions of leadframe 86 to protrude from protective means 90 to provide connection with other devices. Preferably, low-cost leadframe package semiconductor chip 88 comprises a chip front surface 92 and a chip back surface 93, with chip front surface 92 comprising pads 96 for input and output of signals to and from chip 88. Leadframe 86 preferably comprises at least one of power, ground, and signal conductive elements 100 having first end portions 101 and second end portions 102 for transmitting input and output signals to pads 96. Preferably, protective means 76 comprises enclosure means preferably comprising first and second enclosure members 112, 113 respectively, which form a chamber around semiconductor chip 88. Inner surfaces of enclosure members 112, 113 comprise chamber walls 114 which preferably are spaced away from semiconductor chip 88 to permit independent thermal expansion cycling of chip 88 and enclosure members 112, 113. Protective means 76 preferably also comprises barrier sealing means 116 for coating and protecting semiconductor chip 88 from environmental contamination, and package sealing means 117 for sealing the interface between enclosure members 112, 113 or between protective means 76 and a next level of packaging.

Figure 13A:
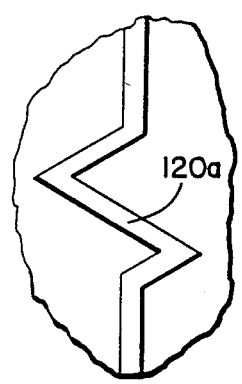
FIG. 13A is a top plan view of an angled stress relief means.
Figure 13B:
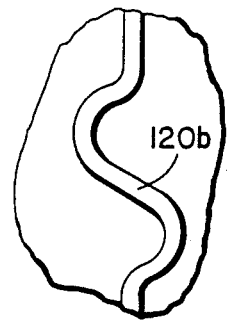
FIG. 13B is a top plan view of an undulating stress relief means.
Figure 13C:
FIG. 13C is a side elevation view of an arched stress relief means.

Protective means 76 may also further comprise stress relief means 120, shown in FIGS. 10, 13A, 13B, and 13C, positioned between chamber walls 114 and semiconductor chip 88 for relieving mechanical fatigue caused by thermal stress to chip 88, leadframe 86, and protective means 76 during thermal cycling. Stress relief means 120 preferably comprises a stress relief expansion portion 122 of conductive elements 100 configured for maintaining conductivity of signals passing from leadframe 86 to and from chip 88 independent of thermal cycling induced stresses. FIG. 13A illustrates a top view of stress relief means 120 configured as an angular stress relief means 120a. Similarly, FIG. 13B illustrates a top view of an undulating stress relief means 120b constructed and arranged to relieve mechanical fatigue caused by thermal stress to chip 88, leadframe 86, and protective means 76 during thermal cycling. FIG. 13C is a side elevation view of stress relief means 120 configured as a flexible arched stress relief means 120c.

Therefore, the preferred low-cost leadframe package invention encapsulates the semiconductor with an open cavity 126. Further, the portion of leadframe 86 which is within cavity 126 preferably comprises stress relief means 120 to minimize fatigue caused by thermal stresses. Accordingly, the invention preferably includes encapsulated stress relief expansion means 120 for permitting thermal expansion induced movement of the components without losing conductivity or without causing device failure. Further, this is important in that it allows choices of different component materials which might otherwise experience mutually unacceptable thermal expansion differences. Another way of stating this feature is that this low-cost package maintains conductivity for signals passing to and from the leadframe and the chip independent of thermal cycling induced stresses.

At least one of enclosure members 112, 113 of low-cost leadframe package 84 may comprise a next level of packaging. Also, second end portions 102 of conductive elements 100 may comprise means for connecting package 84 to a printed circuit board 130 without intermediate packaging. This demonstrates yet another advantage of the present low-cost package invention which includes cooling features relating to how chip 88 is connected to the package. Specifically, semiconductor chip 88 front surface 92 is configured with chip pads 96 and back surface 93 is configured for bonding to a portion of protective means 90. This configuration takes advantage of the thermal resistance feature in back-side mounting by placing more area of the chip in contact with a heat-sink during operation than if the heat to be dissipated had only the solder bond and air to provide heat sinking. Stiffening means may also be provided in the package to facilitate mounting on a printed circuit board or other level of packaging. Low-cost leadframe package 84 barrier sealing means 116 preferably comprises polyimide material while the bonding means preferably comprises solder bump material.

Low-cost leadframe package 84 may also comprise a high-density low-cost leadframe package configured for direct connection with a printed circuit board or other level of packaging. The high-density low-cost leadframe package would preferably comprise a semiconductor chip 88 having bonding pads 96 comprising fine pitch bonding pads with a pattern repetition of substantially less than 0.02 inch (0.51 mm). Similarly, leadframe 86 may comprise fine pitch conductive elements, and the bonding means may comprise means for connecting the fine pitch conductive elements to the fine pitch pads. This high-density low-cost leadframe package embodiment preferably comprises pads 96, located on semiconductor chip 88, and leadframe conductive elements 100, which are spaced at a pitch of between about 0.003 inch (0.076 mm) and 0.008 inch (0.203 mm). Preferably, those portions of conductive elements 100 extending outside protective means 90 are spaced at a pitch of between about 0.004 inch (0.102 mm) and about 0.010 inch (0.254 mm).

Referring again to FIG. 10, a method of constructing low-cost leadframe package 84 is disclosed. Preferably, this method of construction comprises the steps of providing semiconductor chip 88 having pads 96 for input and output of signals to and from the chip, and positioning a leadframe 86 for connection with chip 88. Preferably leadframe 86 comprises at least one of power, ground, and signal conductive elements 100 with first end portions 101 and second end portions 102 for transmitting input and output signals to pads 96. A chip and leadframe package is then formed by bonding conductive elements 100 to chip pads 96 using preformed solder bumps 16. Then, protective means 76 is placed to provide sealed and environmental protection around semiconductor chip 88 and portions of leadframe 86 while permitting other portions of leadframe 86 to protrude from protective means 76 to provide connection with other devices. A preferred method of construction includes protective means 76 comprising a first enclosure member 112 and a second enclosure member 113 placed around semiconductor chip 88 to form a chamber. Preferably, the enclosure members each comprise inner surfaces comprising chamber walls 114 spaced away from semiconductor chip 88 to permit independent thermal expansion cycling of chip 88 and enclosure members 112, 113. Further, a preferred method of assembling the above device includes connecting conductive element second end portions 102 with a printed circuit board 130 without intermediate packaging.

It is appreciated that the method described above may include use of a leadframe comprising a tape leadframe having a plurality of conductive elements separated and carried by tape means such as a dielectric material. In addition to providing protective means 76, stress relief means 120 may be provided. More particularly, the method of construction of low-cost leadframe package 84 preferably further comprises the step of positioning stress relief means 120 between chamber walls 114 and semiconductor chip 88 for relieving mechanical fatigue caused by thermal stress to chip 88, leadframe 86, and protective means 76 during thermal cycling.

Within the field of packaging technology, substantial costs are expended in bonding die or active devices to leadframes. This expense is driven by the ever increasing number of bonds per die which are required. Therefore, as the capabilities of semiconductor chips increase, so also does the number of bonds per die. Various developments have been suggested in the art to reduce the time and energy required to bond die to leadframes but a representative pattern of process steps has emerged as an industry practice. FIG. 11 schematically represents the prior art process of tab assembly. As illustrated in FIG. 11, a first leadframe must be attached to the die. Then, the die is excised from the first leadframe and epoxy bonded to the package. The first leadframe must then be attached to the package and a lid must then be welded thereon. However, further steps are required. These steps include bonding the second leadframe to the package in order to provide a conductive path from the die through the package to external devices. Only then is the assembled package ready for functional test. It is not uncommon in the prior art to have a requirement of in excess of 1000 bonds per tab assembly. The present low-cost tab package invention identifies and eliminates numerous prior art tab assembly steps. Indeed, as illustrated in FIG. 12, the low-cost tab package invention requires fewer process steps and a greatly reduced number of bonds per assembled die. Particularly, as shown in FIG. 12, the low-cost tab package invention requires attaching a leadframe to a die. Then the chip is epoxy bonded to a package. Next, a lid is sealed on the package and the package is then ready for functional test. As illustrated in FIG. 10, the innovation of providing a protective means around a continuous leadframe eliminates the requirement in the prior art for hundreds of bonds on most high performance chips. A simple measure can be made of the enormous impact this invention has on large scale chip production processes. For example, the savings per chip in numbers of bonds eliminated as compared with identical interconnect requirements in the prior art readily exceeds 50%, and the reliability is greatly increased. This great reduction of bond requirements per chip has enabled the applicant to manufacture these devices achieving production efficiencies heretofore unknown.

Figure 15A:
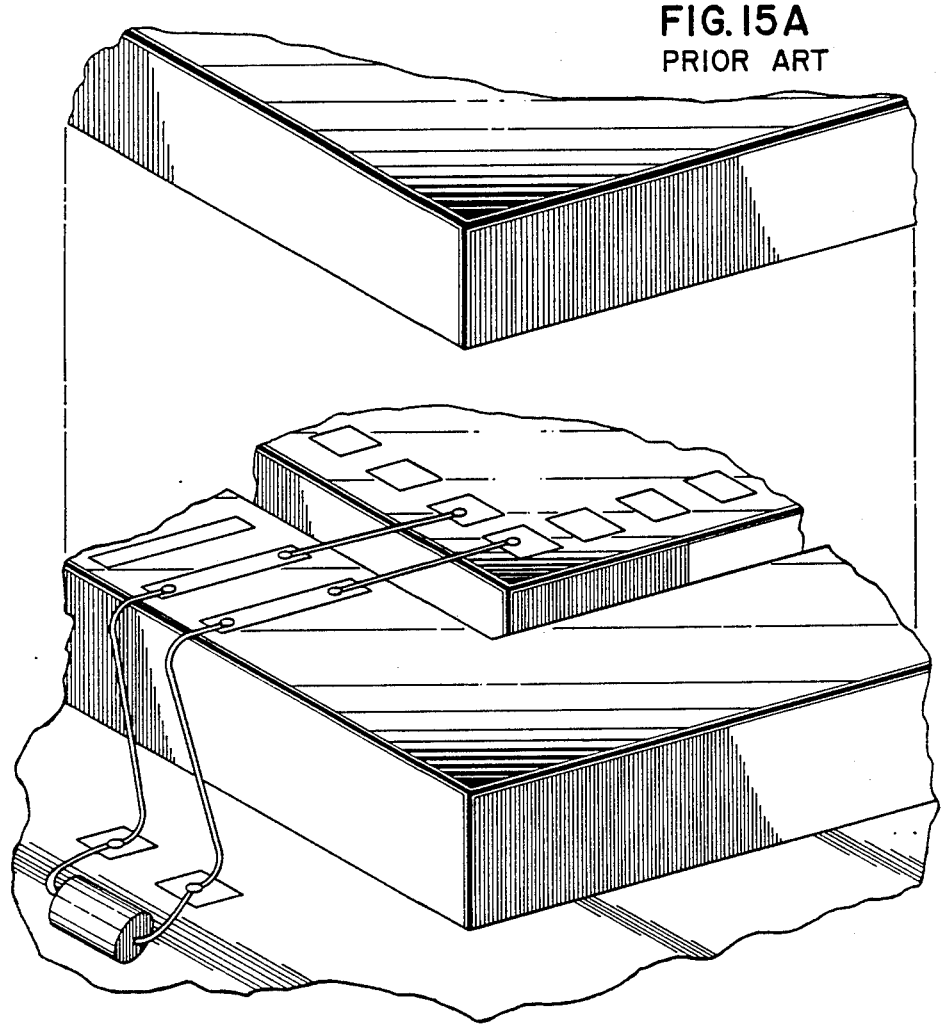
FIG. 15A is a diagrammatic view of a representative prior art leadframe and chip assembly illustrating a capacitor which is mounted externally of the assembly to a printed circuit board.
Figure 15B:
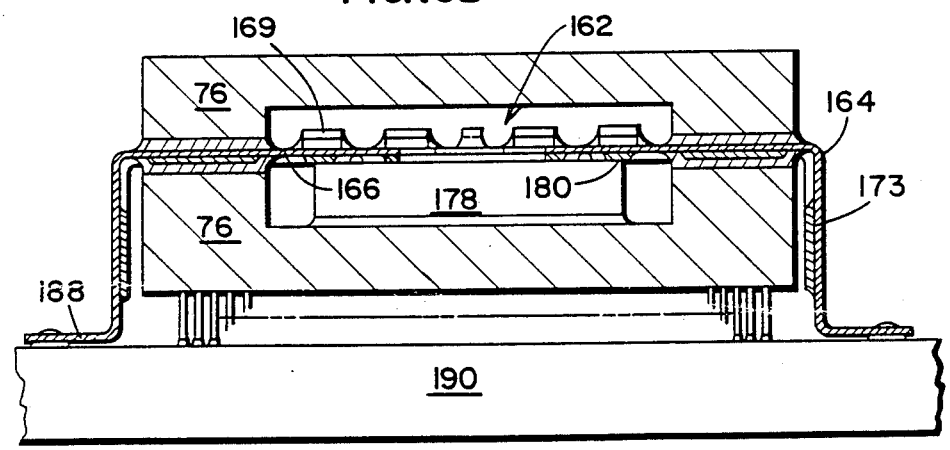
FIG. 15B is a side sectional view of a filter leadframe assembly partially within protective means and mounted to a next level of packaging.

FIG. 15B illustrates another leadframe configuration designed for improved signal performance. As shown, filter leadframe assembly 162 is provided for improving the signal-to-noise ratio in high performance packaging. Preferred filter leadframe assembly 162 comprises a leadframe 164 having conductive elements 166 for providing at least one of power, ground, and signal conductive paths to and from electronic components such as a semiconductor chip. Capacitor means for providing electrical decoupling to the leadframe assembly is provided. Preferably, capacitor means comprises at least one decoupling capacitor 169 attached between power and ground conductive elements of leadframe 164.

Signal fidelity in typical leadframe devices is degraded by electrical noise which may otherwise be eliminated or minimized by use of decoupling capacitors 169 arranged according to the present filter leadframe invention. The closer to a semiconductor chip's power and ground connections that a particular decoupling capacitor is placed, the more effective the noise reduction capability of that capacitor becomes. Conventional decoupling capacitors are typically mounted on printed circuit boards and packages as shown in FIG. 15A. However, by mounting decoupling capacitors 169 directly onto leadframe 164, as shown in FIG. 15B, the capacitors are now located virtually as close as possible to the respective power and ground connections in order to maximize their decoupling effect. Various means of attaching decoupling capacitors 169 to leadframe power and ground conductive elements 166 are available, such as use of solder paste, solder preforms, or conductive epoxy. Filter leadframe assembly 162 preferably comprises a tape leadframe having dielectric material 173 for separating conductive elements 166. Conductive elements 166 are preferably comprised of copper material.

As shown in FIG. 15B, filter leadframe assembly 162 may also include integral component means comprising a semiconductor chip 178 having interface regions 180 for input and output of signals to and from the chip. Semicoductor chip 178 is preferably connected to leadframe 164 so that at least one decoupling capacitor 169 is positioned above chip interface regions 180 to provide signal decoupling while minimizing the separation between chip 178 interface regions and capacitor 169.

Filter leadframe assembly 162 may further comprise protective means 76. Protective means 76 is constructed and arranged to provide sealed and environmental protection around semiconductor chip 178 and portions of tape leadframe 164 while permitting other portions of tape leadframe 164 to protrude from protective means 185 to provide connection with other devices. FIG. 15B further illustrates filter leadframe assembly 162 having leadframe second end portions 188 extending from protective means 185 to provide a connection with a printed circuit board 190 without any intermediate packaging. The open regions may be provided in filter leadframe assembly 162 to provide flexure and prevent fracture or cracking of the assembly.

The present solder composition invention, to be discussed next, relates to a system of packaging and bonding electronic components to achieve manufacturing efficiencies, improved performance, and greater reliability. Significant improvements in electronic package reliability have been achieved according to the teachings of this invention by use of soft solder bump compositions. Although various compositions may be utilized, it is preferable to use a composition which maintains a single solid phase metallurgical state throughout a wide range of thermal environments. For example, it is not uncommon for electronic components to be exposed to diverse operating environments ranging from very high temperatures to well below room temperature. Many conventional bonding compositions experience phase changes between solid and liquid during such temperature migrations which lead to metal fatigue. This clearly represents an undesirable characteristic, causing substantial reliability problems for systems and components using such bonding materials.

The present solder composition invention discloses a preferred tin-lead solder composition which maintains a single phase solid at substantially wider temperature ranges than is presently experienced by solder bonding material used in the field of electronic bonding compositions. More specifically, use of a composition comprising less than 3% by weight of tin and more than 97% by weight of lead results in substantially higher reliability bonds. For example, testing of 1% by weight tin solder bumps reveals reliability figures which exceed those of higher tin content bumps, such as 3% to 6% by weight tin, by a factor of three times.

Figure 16:
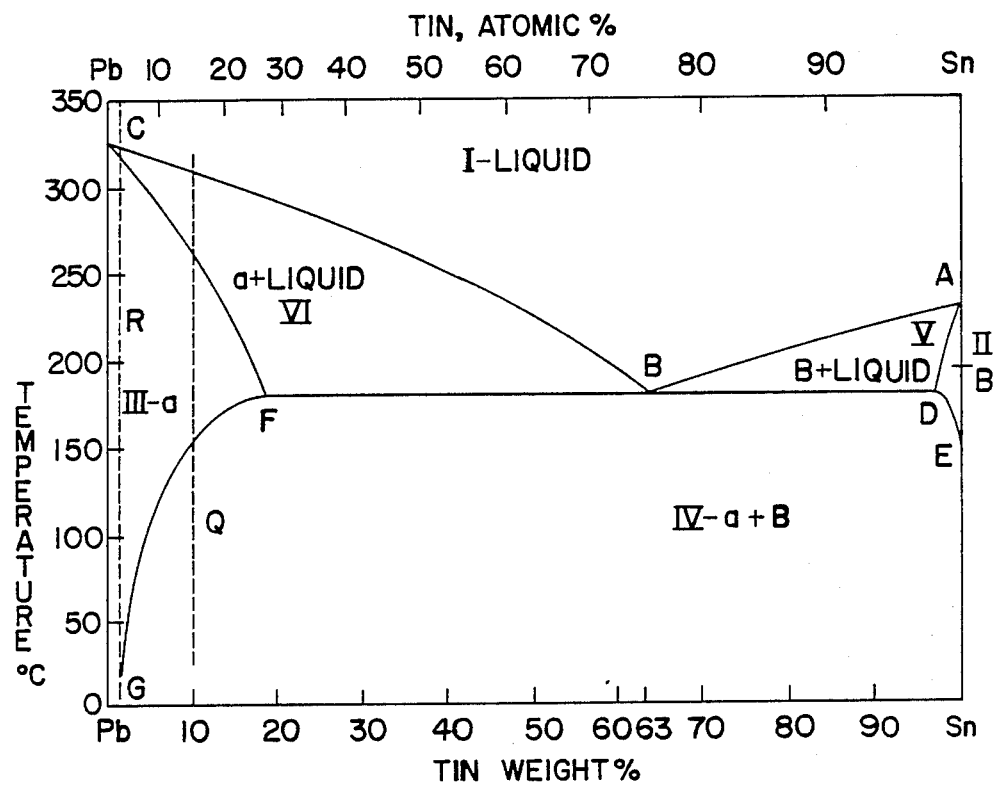
FIG. 16 is a phase versus temperature diagram showing a tin-lead composition.

Referring now to FIG. 16, a simplified tin-lead phase diagram is provided. The tin-lead composition illustrated will be totally liquid and in complete solution at the temperatures above line A B C. Line A B C is thus referred to as the liquidus of this system. Therefore, all of the region marked I is completely liquid. Regions II and III in the diagram marked Beta ($\beta$) and Alpha ($\alpha$), respectively, are areas of solid solution. When an alloy of a given composition and a given temperature falls within the regions of $\alpha$ and $\beta$, it will have a single phase. Lines A D and C F, which form the upper limits of these regions, are called the solidus as is line D F. Any material underneath solidus A, D, F, C, will be a complete solid. The material in area IV consists of a combination of $\beta$ and $\alpha$ in various ratios. The curvature of lines F G and D E indicates that the amount of solute (primary element) in the solid solution of regions II and III diminishes with cooling and that area IV consists of a double phase where $\alpha$ and $\beta$ coexist in various configurations. Regions V and VI as shown in the diagram lie between the solidus and the liquidus of the system and therefore consist of $\beta$ plus liquid and $\alpha$ plus liquid, respectively. These regions are usually labelled the pasty range. Most known solder compositions for electronic bonding reside in this pasty range. However, as solid crystals of $\beta$ or $\alpha$ are disbursed in a liquid solution of tin and lead and as the temperature is lowered, the liquid can no longer dissolve the large quantity of the second phase, and more crystals of $\beta$ and $\alpha$ are formed until a eutectic temperature is reached or the balance of the material freezes totally in a mixture of $\alpha$ and $\beta$.

As shown in FIG. 16, line Q represents an alloy having 90% by weight lead and 10% by weight tin. As the alloy migrates from high temperature liquid solution to cooler temperatures, it passes through various metallurgical phases. Upon initial cooling it passes first into the pasty range where the alloy starts forming crystals of $\alpha$ in region VI. Upon further cooling the alloy totally freezes in the form of a solid $\alpha$ phase in region III. Yet as the alloy crosses line F G to a cooler temperature, the solid solution can no longer hold all of the tin and a formation of the $\beta$ phase results in a two phase region shown by the $\beta$ and $\alpha$ coexistence in region IV.

As FIG. 16 further illustrates, only in the case of compositions similar to that represented by line R, which is a 98% by weight lead and 2% by weight tin composition, would a single phase of $\alpha$ exist at normal room temperatures. Indeed, such low tin content compositions provide the widest range of a single phase solid solder composition. As a result, soft solder bonding material made from very low tin content alloys experience no metallurgical phase changes during wide ranges of operating temperature, thus increasing the bonding material reliability and resistance to thermal induced fatigue.

Accordingly, it is preferable to utilize a soft solder bonding material for providing conductive electronic component high-strength bonding which maintains a single phase solid state between such wide temperature ranges of at least approximately $-65°$ C. to approximately 200° C. Preferred soft solder bonding material comprises a tin and lead composition. Thus, a composition is desirable which comprises tin and lead wherein the percent by weight of tin is substantially equal to or less than the value at which the composition changes from the single phase solid $\alpha$ state to the two phase solid $\alpha$ plus $\beta$ state at substantially 0° C. This tin lead composition solder bonding material may further comprise a solder bump configured for preformed placement and subsequent reflow bonding between electronic components.

As illustrated in FIG. 16, preferred solder bonding material, which may be in the form of a solder bump, comprises less than 3% by weight of tin and more than 97% by weight of lead in order to optimize the thermal cycling range of stability. More particularly, preferred solder bump material for use in interconnecting electronic components comprises between about 0.5% to about 2% by weight of tin, and between about 98% to about 99.5% by weight of lead. Components manufactured within this preferred tin content range were thermal cycled from $-65°$ C. to 150° C. beyond 1000 cycles without failures. In contrast, previous tests using approximately 3% to 6% tin content solder bonding material experienced failures at 200 or less cycles.

It is appreciated that at least some applications of preferred soft solder bonding material according to the present solder composition invention may be suitable for use in environments outlined within U.S. Department of Defense Military Standard 883. Accordingly, a solder bonding material, which may be in a preformed bump configuration, is provided for conductive electronic component high-strength bonding which exceeds by an order of magnitude the minimum number of 100 thermal cycles required by U.S. Department of Defense Military Standard 883 method 1010 over a temperature of $-65°$ C. to 150° C. This solder bonding material preferably comprises an effective amount less than 3% by weight of tin, and more than 97% by weight of lead. More specifically, such solder bonding material preferably comprises a composition of between about 0.5% to about 2% by weight of tin, and between about 98% to about 99.5% by weight of lead.

Another way of stating the present solder composition invention is to provide a solder bonding material for conductive electronic component high-strength bonding which exceeds by an order of magnitude the minimum number of 100 thermal cycles required by U.S. Department of Defense Military Standard 883 method 1010 over a temperature range of $-65°$ C. to $+150°$ C. and which comprises a composition of tin and lead wherein the percent by weight of tin is substantially equal to or less than the value at which the composition changes from the single phase solid $\alpha$ state to the two phase solid $\alpha$ state at substantially 0° C. Similarly, the present invention discloses a solder bump material for use in interconnecting electronic components comprising a composition for maintaining a single phase solid state over the temperature range of U.S. Department of Defense Military Standard 883 method 1010 of $-65°$ C. to 150° C. thermal cycling requirements.

As previously mentioned, the use of this solder composition invention may include placing the solder composition on semiconductor chips to provide high-reliability bonding in a manner not previously known or appreciated in the field of electronic packaging technology.

The present solder composition invention further comprises a leadframe assembly having conductive elements preformed with high-strength solder bumps for use in interconnecting the leadframe with an electronic device. This leadframe assembly preferably comprises leadframe means comprising at least one of power, ground, and signal conductive elements for transmitting input and output signals to bonding locations on an electronic device. The leadframe also preferably comprises solder bumps preformed on the conductive elements for selective bonding with bonding locations on the electronic device. The solder bumps preferably comprise a composition for maintaining a single solid phase over the temperature ranges of 0° C. to 150° C. Alternately, the solder bumps of this leadframe assembly may comprise about 0.5% to about 2% by weight of tin, and about 98% to about 99.5% by weight of lead. Moreover, the solder bumps of the leadframe assembly may comprise both a composition for maintaining a single solid phase over the temperature range of 0° C. to 150° C. as well as about 0.5% to about 2% by weight of tin and about 98% to about 99.5% by weight of lead. A leadframe assembly having any of the above solder bump composition characteristics may further comprise a tape leadframe having dielectric material for separating the conductive elements.

This solder composition invention further discloses a method of manufacturing a bond-when-ready bumped leadframe comprising the steps of providing a leadframe comprising at least one of power, ground, and signal conductive elements; and preforming solder bumps onto the conductive elements to provide means for selectively bonding the conductive elements to bonding locations of an electronic device, and the solder bumps being preformed having a composition for maintaining a single solid phase over the temperature range of 0° C. to 150° C. Alternately, the solder bump composition of the solder bumps to be preformed as part of the above method of manufacturing a bond-when-ready bumped leadframe may comprise a composition of about 0.5% to about 2% by weight of tin, and about 98% to about 99.5% by weight of lead. Indeed, a preferred method of manufacturing a bond-when-ready bumped leadframe may comprise solder bumps with a composition for both maintaining a single solid phase over the temperature range of 0° C. to 150° C. and comprising about 0.5% to about 2% by weight of tin and about 98% to about 99.5% by weight of lead.

A low-cost high-strength leadframe and semiconductor chip assembly is also provided according to the present solder composition invention. A preferred low-cost high-strength leadframe and semiconductor chip assembly comprises a semiconductor chip comprising bonding locations for input and output of signals to and from the chip. The assembly further comprises leadframe means comprising at least one of power, ground, and signal conductive elements for transmitting input and output signals to the bonding locations on the semiconductor chip. Also, this low-cost high-strength leadframe and semiconductor chip assembly comprises solder bump means comprising solder bumps reflowed between corresponding leadframe conductive elements and bonding locations on the semiconductor chip. The solder bumps preferably have a composition for maintaining a single solid phase over the temperature range of 0° C. to 150° C. Alternately, the solder bumps may have a composition comprising about 0.5% to about 2% by weight of tin, and about 98% to about 99.5% by weight of lead. However, yet another low-cost high-strength leadframe and semiconductor chip assembly according to this solder composition invention comprises solder bump means comprising solder bumps having a composition for maintaining a single solid phase over the temperature range of 0° C. to 150° C., and that composition comprises about 0.5% to about 2% by weight of tin and about 98% to about 99.5% by weight of lead. Similarly, a method of manufacturing a low-cost high-strength leadframe and semiconductor chip assembly is provided. Preferred steps for this assembly method comprise providing a semiconductor chip comprising bonding locations for input and output of signals to and from the chip; providing leadframe means comprising at least one of power, ground, and signal conductive elements for transmitting input and output signals to the bonding locations on the semiconductor chip; providing solder bump means comprising solder bumps positioned between corresponding leadframe conductive elements and bonding locations of the semiconductor chip, the solder bumps having a composition for maintaining a single solid state phase over a temperature range of 0° C. to 150° C.; and reflowing the solder bumps to join the corresponding leadframe conductive elements with the bonding locations on the semiconductor chip. The composition of the solder bumps in the above preferred method may comprise about 0.5% to about 2% by weight of tin, and about 98% to about 99.5% by weight of lead rather than being defined by having a characteristic property of maintaining a single solid phase over a temperature range of 0° C. to 150° C. only. However, yet another preferred method of manufacturing a low-cost high-strength leadframe and semiconductor chip assembly includes solder bumps having a composition comprising about 0.5% to about 2% by weight of tin and about 98% to about 99.5% by weight of lead, and that composition maintains a single solid phase over a temperature range of 0° C. to 150° C.

This solder composition invention further comprises a method of manufacturing a low-cost high-strength leadframe and semiconductor chip assembly following the steps of providing a semiconductor chip comprising bonding locations for input and output of signals to and from the chip; bonding leadframe means comprising at least one of power, ground, and signal conductive elements for transmitting input and output signals to the bonding locations on the semiconductor chip; providing solder bumps preformed to the semiconductor chip bonding locations, the solder bumps having a composition for maintaining a single solid phase over the temperature range of 0° C. to 150° C.; aligning the solder bumps preformed on the semiconductor chip bonding pads with corresponding leadframe conductive elements; and reflowing the solder bumps to join the corresponding leadframe conductive elements with the bonding locations on the semiconductor chip. This method of manufacturing a low-cost high-strength leadframe and semiconductor chip assembly may alternately comprise solder bumps having composition comprising about 0.5% to about 2% by weight of tin, and about 98% to about 99.5% by weight of lead.

Yet another preferred embodiment of this solder composition invention comprises a low-cost high-yield high-strength semiconductor chip and leadframe assembly kit comprising a semiconductor chip comprising bonding locations for input and output of signals to and from the chip; a leadframe having at least one of power, ground, and signal conductive elements for transferring signals to and from the chip bonding location; and bonding means comprising solder bumps preformed to the leadframe conductive elements for selective bonding with bonding locations on the semiconductor chip, the solder bumps comprising a composition for maintaining a single solid phase over a temperature range of 0° C. to 150° C. The solder bumps may further comprise a composition comprising about 0.5% to about 2% by weight of tin, and about 98% to about 98.5% by weight of lead. Alternately, this assembly kit may comprise bonding means comprising solder bumps preformed to the leadframe conductive elements for selective bonding with bonding locations on the semiconductor chip. The solder bumps may comprise about 0.5% to about 2% by weight of tin, and about 98% to about 98.5% by weight of lead. Further advances in the field of packaging and bonding of electronic components include the following improved furnace bonding structure and method.

The basic furnace bond technique of electronic component bonding is well-known. A device to be bonded is placed in a furnace for heating and low-force bonding of conductive elements. A frequent problem arises, however, in unequal compression forces being applied to various conductive elements being bonded. Often, this unbalanced bonding force results in over-compression of certain conductive elements and insufficient compression being applied to other conductive elements. In each case, the reliability of the overall package is degraded. Accordingly, the present invention provides means for controlled compression furnace bonding of conductive elements of a leadframe to a semiconductor chip without experiencing the compression problems in the prior art. Specifically, a bonding system 208, shown in FIG. 17, is provided comprising holding means having a holding member with a chip support surface for supporting a semiconductor chip, positioning means for precisely positioning conductive elements of a leadframe with bonding locations on the semiconductor chip, and furnace heating means comprising a furnace for heating and reflow bonding the conductive elements to the chip bonding locations.

Figure 17:
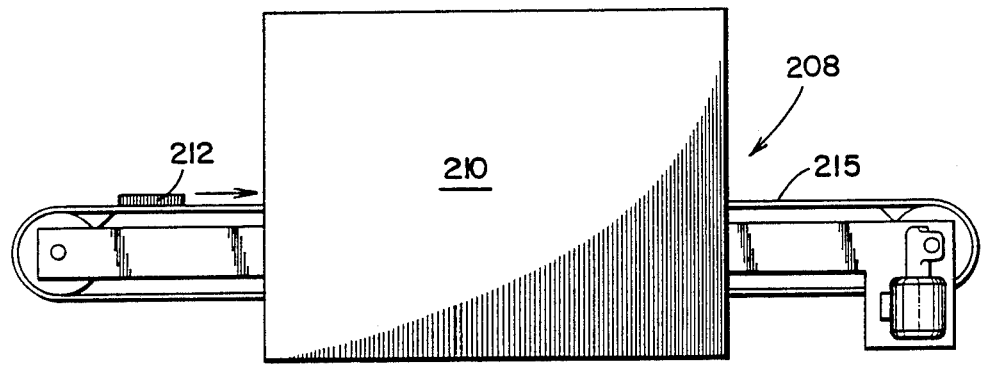
FIG. 17 is a side elevation view of a representative belt furnace bonding mechanism.

As illustrated in FIG. 17, a representative furnace bonding cycle comprises furnace means which is preferably a belt furnace 210 configured for heating the conductive elements and the semiconductor chip which are both retained in a holding member 212. The belt furnace 210 preferably comprises a belt member 215 which transports holding member 212 through the belt furnace 210. Preferred belt furnace 210 comprises means for creating a neutral or reducing atmosphere surrounding locations on the chip where the conductive elements are to be bonded. This neutral or reducing atmosphere thereby permits fluxless bonding of the materials.

As illustrated in FIG. 18, means for positioning the semiconductor chip in holding member 212 is provided. Vacuum means is configured in chamber 220 for creating a vacuum to temporally hold the semiconductor chip 223 and to facilitate fine alignment of chip 223 with conductive elements 225 of a leadframe 226. Chamber 220 also minimizes the exposure of chip 223 to heat retaining portions of holding ember 212. The positioning means further comprises a clamp spring assembly represented by force arrows labelled J for securely clamping the positioned chip 223 and leadframe 226 prior to heating the chip in furnace 210. Preferably, bonding device 208 positioning means further comprises alignment pegs 230 constructed and arranged for engaging and aligning leadframe 226. Also, surfaces 232 defining alignment holes 233 are located in holding member 212 as shown. Alignment holes 233 are preferably constructed and arranged for slidable receipt of alignment pegs 230. As illustrated in FIG. 18, the interaction of alignment pegs 230 and alignment holes 233 provides coarse alignment to conductive elements 225 in relation to chip 223 bonding locations.

Holding member 212 illustrated in FIG. 17 comprises means for maintaining lead-to-bump alignment as well as for ensuring the required contact between solder bumps 235 and conductive elements 225. The contact between solder bumps 235 and conductive elements 225 is achieved through use of either a rigid insert or a conformal insert. The rigid insert 240 is constructed and arranged for use with soft solder bump applications. Rigid insert 240 is preferably placed on top of leadfram conductive elements 225 which are arranged vertically above chip 223. Thus, rigid insert 240 exerts a gravity generated compression force on the leadframe and ensures that conductive elements 225 are all sufficiently contacting appropriate chip bonding locations. The controlled compression effect of placing rigid insert 240 on conductive elements 225 promotes uniform bonding of each conductive element 225 with semiconductor chip 223 independent of any initial non-planarity of conductive elements 225 and any difference in bump heights of solder bumps 235 located on chip 223. Preferred insert material includes a quartz material due to its excellent thermal isolation characteristics. When using bonding device 208 according to the present invention, it is also desirable to provide standoff means 242 for maintaining the vertical height of conductive elements 225 in relation to chip 223.

Alternately, a hard bonding material may be utilized to maintain the conductive element height above the chip surface 244. However, use of hard materials may lead to cracking or other damage to chip 223 when compression bonding force is applied. Therefore, as illustrated in FIG. 19, conformal insert 248 may be utilized. Conformal insert 248 is constructed and arranged to function similarly to rigid insert 240 with the exception of permitting nominal insert compression to accommodate different heights among bumps made of hard material located on chip 223. This characteristic eliminates one source of manufacturing process component damage and thus enhances the reliability of components made with the present invention. Bonding device 208 may be utilized with conductive elements having preformed reflowable solder bumps attached. Preformed reflowable solder bumps may also be configured as earlier described and shown on chip 223. Also, rigid insert 240 and conformal insert 248 are readily interchangeable to facilitate efficiency and reduce tooling requirements.

Material savings and component cleanliness is enhanced when the present furnace bonding invention is utilized in a neutral or reducing atmosphere surrounding solder bumps 235 during the bonding process. When the process is accomplished within a nitrogen atmosphere, fluxless bonding may be achieved.

Accordingly, a method is provided for controlled compression furnace bonding of a semiconductor chip to conductive elements of a leadframe. This method comprises the steps of placing a semiconductor chip 223, as shown in FIG. 18, comprising a plurality of bonding locations in a holding member 212 comprising a chip support surface 222; providing preformed bonding material for connecting conductive elements 225 of a leadframe 226 with the chip bonding locations; aligning the leadframe conductive elements with the bonding locations on the semiconductor chip; moving the leadframe conductive elements toward the chip bonding locations so that the bonding material contacts the conductive elements and the chip bonding locations; heating the bonding material to a point of reflow; and cooling the bonding material to complete the bonding process. This method may further comprise the step of creating a neutral or reducing atmosphere surrounding the bonding material during the bonding process. Also, the step of positioning the semiconductor chip preferably comprises placing the chip on a chip support surface above a chamber extending into the holding member; creating a vacuum for temporarily holding the chip while precisely aligning the chip with the leadframe conductive elements; and locking the chip in alignment with the leadframe conductive elements prior to heating the assembly. The positioning of preformed bonding material may comprise positioning preformed solder bumps on the leadframe conductive elements or on the semiconductor chip bonding locations.

In the event that fluxless furnace bonding is not utilized, then a fluxing agent according to the present invention can provide for improving the bonding process by yet other means. For instance, the present fluxing agent is particularly cost effective because its preferred constituents are inexpensive, readily available, and easily mixed. Furthermore, expenses related to cleaning bonded surfaces, after these surfaces are bonded with prior art fluxing agents, can be substantially reduced because the present fluxing agent minimizes or substantially eliminates the charring which generally occurs when the prior art fluxing agents are used. The use of a fluxing agent or flux is generally not necessary when using gold bonding material. However, when using solder bonds in normal atmospheres, it is necessary to use flux to promote oxide-free surfaces for joining at the bond site. Activated fluxes such as those with ammonium chloride, zinc chloride, hydrogen chloride, or other well known activating agents are generally quite acidic and can be toxic. The residue that is often left behind after use of activated fluxes can corrode components and cause other difficulties. In contrast, use of a preferred fluxing agent, containing oil and rosin, leaves a substantially inert residue which, even when left on the component surface, will not cause the problems associated with the activated fluxing agents noted above. Prior solutions to the problems of charring and corrosive flux residue have included use of alcohol constituents combined with flux or flux constituents. The alcohol tends to evaporate, however, thereby reducing its effectiveness. When isopropyl alcohol is used in a fluxing agent including water white rosin, the flux often dries and chars during the tabbing process and is difficult, if not virtually impossible to clean. The charred flux can prove to be a source of ionic contamination, or an aesthetic problem. The present fluxing agent preferably utilizes a combination of rosin and oil to solve the ongoing problem of charring of bonding areas.

The preferred fluxing agent preferably includes low-cost, readily available, and normally non-hazardous materials. The preferred fluxing agent is easily mixed and dispensed, and is easily removed from the bonding site. Because the present fluxing agent preferably includes an oil or combination of oils which have ignition temperatures which are preferably greater than the temperatures required to bond solder to a surface, the charred residue, which often results from the burning of prior art fluxing agents, is substantially minimized or eliminated. The preferred fluxing agent comprises between about 5-95, preferably 10-90, more preferably 20-80, even more preferably 30-70% by weight of oil and between about 5-95, preferably 10-90, more preferably 20-80, even more preferably 30-70% by weight of rosin. Another fluxing agent according to this invention consists essentially of about 5-95% by weight of oil and about 5-95% by weight of rosin. The addition of oil to the rosin adjusts the viscosity of the flux, thereby making it easier to handle and dispense. However, the addition of the oil has not been found to decrease the effectiveness of the rosin in minimizing the formation of oxides during soldering. Indeed, it is believed that the addition of the oil may enhance the effectiveness of the rosin, particularly for use with structures having fine geometry spacing. Furthermore, the stability of this combination of constituents is important in that during the temperature increases of the bonding process, the respective percentages of oil and rosin in the flux mixture remain substantially the same.

The preferred oil will preferably have an ignition temperature of at least about 375° C. By selecting an oil having a relatively high burning temperature, the tendency of flux to char during bonding is minimized. Accordingly, an oil or a combination of oils may be utilized providing that the oil or combination of oils has an ignition temperature of preferably at least about 375° C. Preferred oils may be selected from the group consisting of vegetable oils, fish oils, animal oils, mineral oils, and the like or combinations thereof. The preferred oil or combination of oils preferably has an ignition temperature of at least about 390°, more preferably about 400°, even more preferably about 415° and still more preferably about 425° C. It is most preferable that the oil which is selected for use from the above group have an ignition temperature of at least about 430° C. When using a vegetable oil, it is preferable to select the oil from the group consisting of peanut oil, sunflower oil, rapeseed oil, soybean oil, castor oil, jojoba oil, corn oil, and the like or combinations thereof. It will be appreciated that other well known oils exhibiting high ignition temperatures can also be utilized. Most preferably, the vegetable oil is peanut oil and has an ignition temperature of at least about 430° C.

It is generally believed that as the percent by weight of rosin in the preferred fluxing agent approaches 50%, the advantages of the preferred fluxing agent are realized more fully. For example, as composition of rosin approaches 50% the fluxing agent is readily flowable for dispensing and use. Furthermore, it is believed that as the percent by weight of rosin is increased, the anti-charring characteristic of the preferred fluxing agent becomes more apparent during bonding, and the amount of charring which occurs is minimized. Consequently, the preferred fluxing agent preferably comprises at least about 30, more preferably about 40, still more preferably about 50% by weight of rosin. Furthermore, the ratio of the percent by weight of rosin to percent by weight of oil is preferably at least about 0.1, more preferably about 0.5, even more preferably 0.75, still more preferably 0.9, even more preferably 0.95, most preferably about 1.

The choice of rosin for use in the preferred fluxing agent is preferably a substantially inert, non-activated rosin. The preferred rosin preferably comprises water white rosin which is commercially available from numerous sources; however, other rosins exhibiting non-activated characteristics can also be utilized. The preferred oil and rosin combination provides a non-corrosive and non-toxic fluxing agent which is preferable for use with electronic components and which is generally not harmful to personnel in contact with it. Also, when the intended use does not demand a non-activated rosin for electronic safety or other reasons, the present fluxing agent may include an activated rosin which is compatible with the preferred oil composition.

Because the preferred embodiments of the present fluxing agent substantially eliminate charring and the production of charred residue during soldering operations, cleaning of the soldering surface is much easier. For example, the use of especially harsh or toxic cleaning agents is unnecessary. Such surfaces are easily cleaned using relatively mild cleaning agents such as warm xylenes, dry acetone, or the like.

A method for bonding a conductive element with solder is also provided. This method preferably comprises the steps of placing solder and a fluxing agent on a surface of the element to be bonded, the fluxing agent preferably having between about 5–95% by weight of oil and between about 5–95% by weight of rosin. The next step comprises heating the surface, the solder and/or the flux to a temperature of between about 250°–400° C., wherein charring of the fluxing agent is minimized. It is believed that bonding substantially occurs at temperatures of between about 250°– 400°, preferably 300°–400° C., and that if charring can be minimized at those temperatures by the inclusion of an oil or oils having relatively high ignition temperatures, then the charring effect seen with prior art fluxes can be substantially minimized or eliminated.

EXAMPLE 1

An equal amount by weight of a commercially available peanut oil having an ignition temperature of 443° C. and water white rosin distributed under the trade name "Alpha 5002" is mixed together and agitated for approximately 2 minutes at a moderate speed in a glass mixer. The resulting fluxing agent is smooth, viscous, and readily dispensable. When the resulting fluxing agent is applied to a leadframe surface and solder is heated to a reflow temperature of 325° C. proximate to this surface substantially no charring occurs.

It is to be appreciated that while certain embodiments of the present invention have been illustrated and described, the invention is not to be limited to the specific forms or arrangements of parts described and shown above, since others skilled in the art may devise other embodiments still within the limits of the claims.

What is claimed is:

1. A method of manufacturing a high-yield fine pitch geometry solder bumped semiconductor wafer comprising the steps of:
   (a) providing a nonsolderable transfer substrate having a transfer surface for receipt of solder material;
   (b) depositing solder material onto the transfer surface to form solder bumps in a predetermined fine pitch geometry pattern;
   (c) aligning solderable conductive elements of a semiconductor wafer with the patterned solder bumps on the transfer surface; and
   (d) reflowing the patterned solder bumps into wetted contact with the wafer conductive elements.

2. The method according to claim 1 wherein the depositing step comprises:
   (a) locating a shadow mask on the transfer surface; and
   (b) evaporating solder material through apertures in the shadow mask to form solder deposits patterned on the transfer surface.

3. The method according to claim 1 wherein the transfer substrate comprises a transfer surface which is reusable.

4. The method according to claim 1 wherein the depositing step comprises plating solder material onto the transfer surface to form solder deposits in a predetermined pattern.

5. The method according to claim 1 wherein the step of depositing solder material comprises:
   (a) providing a nonsolderable transfer substrate having a plurality of cavities configured for positioning preformed solder material; and
   (b) depositing preformed solder pellets into the transfer surface cavities in a predetermined pattern.

6. A method of manufacturing high-yield fine pitch geometry solder bumped semiconductor chips comprising the steps of:
   (a) providing a nonsolderable transfer substrate having a transfer surface for receipt of solder material;
   (b) depositing solder material onto the transfer surface to form solder deposits in a predetermined fine pitch geometry pattern;
   (c) aligning solderable conductive elements of a semiconductor wafer with the patterned solder deposits;
   (d) reflowing the patterned solder deposits into precise wetted contact with the wafer conductive elements; and
   (e) separating the solder bumped wafer into a plurality of solder bumped semiconductor chips.

7. The method according to claim 6 wherein the deposition step comprises:
   (a) locating a shadow mask on the transfer surface; and
   (b) evaporating solder material through apertures in the shadow mask to form solder deposits patterned on the transfer surface.

8. The method according to claim 6 wherein the transfer substrate comprises a transfer surface which is reusable.

9. The method according to claim 6 wherein the solder depositing step comprises plating solder material onto the transfer surface to form solder deposits in a predetermined pattern.

10. The method according to claim 6 wherein the step of depositing solder material comprises:
    (a) providing a nonsolderable transfer substrate having a plurality of cavities configured for positioning preformed solder material; and
    (b) depositing preformed solder pellets into the transfer surface cavities in a predetermined pattern.

11. A method of manufacturing a high-yield fine pitch geometry solder bumped semiconductor wafer comprising the steps of:
    (a) providing a nonsolderable and reusable transfer substrate having a transfer surface for receipt of solder material;
    (b) depositing solder material onto the transfer surface to form solder bumps in a predetermined fine pitch geometry pattern, the depositing comprising the sub-steps of;
        (i) locating a shadow mask on the transfer surface; and (ii) evaporating solder material through apertures in the shadow mask to form solder deposits patterned on the transfer surface;

(c) aligning solderable conductive elements of a semiconductor wafer with the patterned solder bumps on the transfer surface; and (d) reflowing the patterned solder bumps into wetted contact with the wafer conductive elements.

12. A method according to claim 11 further comprising the step of separating the solder bumped wafer into a plurality of solder bumped semiconductor chips.

13. A method of manufacturing a high-yield fine pitch geometry solder bumped semiconductor wafer comprising the steps of:

(a) providing a nonsolderable and reusable transfer substrate having a transfer surface for receipt of solder material;

(b) plating solder material onto the transfer surface to form solder bumps in a predetermined fine pitch geometry pattern;

(c) aligning solderable conductive elements of a semiconductor wafer with the patterned solder bumps on the transfer surface; and (d) reflowing the patterned solder bumps into wetted contact with the wafer conductive elements.

14. A method according to claim 13 further comprising the step of separating the solder bumped wafer into a plurality of solder bumped semiconductor chips.

15. The method according to claim 13 wherein the plating step comprises plating solder material onto the transfer surface to form fine pitch geometry solder bumps in a predetermined pattern with pitch spacing of less than about 2 mils.

16. A method of manufacturing a high-yield fine pitch geometry solder bumped semiconductor wafer comprising the steps of:

(a) providing a nonsolderable transfer substrate having a plurality of cavities configured for positioning preformed solder material; and (b) depositing preformed solder pellets into the transfer surface cavities in a predetermined fine pitch geometry pattern;

(c) aligning solderable conductive elements of a semiconductor wafer with the patterned solder bumps on the transfer surface; and (d) reflowing the patterned solder bumps into wetted contact with the wafer conductive elements.

17. A method according to claim 15 further comprising the step of separating the solder bumped wafer into a plurality of solder bumped semiconductor chips.

* * * * *